(12) United States Patent
Verhulst et al.

(10) Patent No.: US 8,872,230 B2
(45) Date of Patent: Oct. 28, 2014

(54) TUNNEL FIELD-EFFECT TRANSISTOR AND METHODS FOR MANUFACTURING THEREOF

(71) Applicant: IMEC, Leuven (BE)

(72) Inventors: Anne S. Verhulst, Houtvenne (BE);
Thomas Hantschel, Houtvenne (BE);
Wilfried Vandervorst, Leuven (BE);
Cedric Huyghebaert, Leuven (BE)

(73) Assignee: IMEC, Leuven (BE)

( * ) Notice: Subject to any disclaimer, the term of this patent is extended or adjusted under 35 U.S.C. 154(b) by 38 days.

(21) Appl. No.: 13/679,052

(22) Filed: Nov. 16, 2012

(65) Prior Publication Data
US 2013/0161696 A1   Jun. 27, 2013

(30) Foreign Application Priority Data
Dec. 21, 2011   (EP) ..................... 11194802

(51) Int. Cl.
| | |
|---|---|
| H01L 29/66 | (2006.01) |
| H01L 29/10 | (2006.01) |
| H01L 29/78 | (2006.01) |
| H01L 21/30 | (2006.01) |
| H01L 29/36 | (2006.01) |

(52) U.S. Cl.
CPC ............ H01L 29/78 (2013.01); H01L 29/1025 (2013.01); H01L 29/66356 (2013.01); H01L 21/30 (2013.01); H01L 29/36 (2013.01)
USPC ........................................ 257/192

(58) Field of Classification Search
USPC .......................... 257/243–413, 900, 902–903,
257/E21.19–E21.21, E21.394–E21.458,
257/E21.615–E21.694, 901,
257/E29.116–E29.122, E29.284, E29.299,
257/E21.432, E21.44, E21.619–E21.62;
438/135, 142
See application file for complete search history.

(56) References Cited

U.S. PATENT DOCUMENTS

| | | | |
|---|---|---|---|
| 5,960,271 | A | 9/1999 | Wollesen et al. |
| 6,339,015 | B1 | 1/2002 | Bracchitta et al. |
| 7,208,379 | B2 | 4/2007 | Venugopal et al. |
| 2001/0028087 | A1* | 10/2001 | Hirashita et al. ............... 257/344 |
| 2006/0202266 | A1* | 9/2006 | Radosavljevic et al. ........ 257/344 |
| 2006/0284220 | A1* | 12/2006 | Watanabe et al. .............. 257/288 |
| 2007/0004123 | A1* | 1/2007 | Bohr et al. ..................... 438/230 |
| 2009/0072270 | A1 | 3/2009 | Asbeck et al. |
| 2010/0006928 | A1 | 1/2010 | Pan et al. |
| 2010/0072551 | A1* | 3/2010 | Watanabe et al. .............. 257/347 |

(Continued)

OTHER PUBLICATIONS

Yang et al. Drive Current Enhancement with Invasive Source in Double Gate Tunneling Field-Effect Transistors. Extended Abstracts of the 2010 International Conference on Solid State Devices and Materials, Tokyo, 2010, pp. 798-799.

(Continued)

*Primary Examiner* — Dao H Nguyen
*Assistant Examiner* — Tram H Nguyen
(74) *Attorney, Agent, or Firm* — Knobbe Martens Olson & Bear, LLP.

(57) ABSTRACT

A tunnel Field Effect Transistor is provided comprising an interface between a source and a channel, the source side of this interface being a layer of a first crystalline semiconductor material being substantially uniformly doped with a metal to the solubility level of the metal in the first crystalline material and the channel side of this interface being a layer of this first crystalline semiconductor material doped with this metal, the concentration decreasing towards the channel.

20 Claims, 9 Drawing Sheets

(56) References Cited

U.S. PATENT DOCUMENTS

| | | | |
|---|---|---|---|
| 2012/0037998 A1* | 2/2012 | Bedell et al. | 257/369 |
| 2012/0181586 A1* | 7/2012 | Luo et al. | 257/288 |
| 2012/0200342 A1* | 8/2012 | Wang et al. | 327/537 |
| 2012/0299102 A1* | 11/2012 | Lavoie et al. | 257/347 |
| 2013/0140629 A1* | 6/2013 | Grupp et al. | 257/329 |

OTHER PUBLICATIONS

Uruena et al. Local Al-Alloyed Contacts for Next Generation SI Solar Cells.; 24th European Photovoltaic Solar Energy Conference, Sep. 21-25, 2009, Hamburg, Germany.

Wang, P.-F., et al. Complementary tunneling transistor for low power application, Solid-State Electronics 48 (2004) 2281-2286.

* cited by examiner

US 8,872,230 B2

TUNNEL FIELD-EFFECT TRANSISTOR AND METHODS FOR MANUFACTURING THEREOF

CROSS-REFERENCE TO RELATED APPLICATION

This application claims the benefit of European Application No. 11194802.2 filed Dec. 21, 2011, the disclosure of which is hereby expressly incorporated by reference in its entirety and is hereby expressly made a portion of this application.

FIELD OF THE INVENTION

Tunnel field effect transistors (TFET) are provided, wherein the drive current of the transistor is based on band-to-band tunneling. A method for manufacturing such tunnel field effect transistors is also provided.

BACKGROUND OF THE INVENTION

Nanoelectronic devices are generally fabricated using semiconductor materials and processing for manufacturing the integrated circuits. A complementary metal-oxide-semiconductor (CMOS) field effect transistor is one of the core elements of the integrated circuits. Dimensions and operating voltages of CMOS transistors are continuously reduced, or scaled down, to obtain ever-higher performance and packaging density of the integrated circuits.

One of the problems due to the scaling down of CMOS transistors is that the power consumption keeps increasing. This increase is partly because leakage currents are increasing, e.g. due to short channel effects, and partly because it becomes difficult to further decrease the power supply voltage. As the physical subthreshold swing for CMOS transistors is limited to about 60 mV/decade, a minimal power supply voltage will be needed to switch the transistor from the OFF state to the ON state.

Tunnel field-effect transistors (TFETs) are typically advertised as successors of metal-oxide semiconductor field-effect transistors (MOSFETs), because of their absence of short-channel effects and because of their resulting low off-currents. Another advantage of TFETs is that their theoretical subthreshold swing can be less than 60 mV/dec, the physical limit of conventional MOSFETs, thereby offering the potential of operating at lower supply voltages compared to CMOS transistors.

However, all-silicon TFETs, i.e. with channel and source/drain regions formed in silicon, typically suffer from low on-currents, a drawback related to the large resistance of the tunnel barrier. Heterostructure TFETs, i.e. with different semiconductor materials for the source and at least a part of the channel region, are promising as they combine a high on-current ($I_{on}$) due to efficient tunneling at the source-channel region with a low off-current ($I_{off}$) due to inefficient tunneling at the channel-drain region. However for such heterostructure TFET's an average subthreshold swing of less than 60 mV/dec for reasonable Ion/Ioff values has not been achieved.

Theoretical studies show that a tip-shaped source region with a uniform shape in the third dimension such that the shape of the source/channel junction is constant along the width of the channel, is beneficial to improve the subthreshold swing. For example Yue Yang et al. reports in "Extended Abstracts of the 2010 International Conference on Solid State Devices and Materials (SSDM)", page 798-799 entitled "Drive current enhancement with invasive source in double gate tunneling field-effect transistors" simulation results for a Ge TFET structure comprising an invasive p+ source structure, wherein this p+ region in the middle of the channel extends under the gate. This structure results in an increased tunneling region and as such also in a higher on-current $I_{on}$.

P. F. Wang, K. Hilsenbeck, Th. Nirschl, et al. report in Solid-State Electronics 48, p. 2281 (2004) simulation results indicating higher source doping levels and steeper source doping profiles may result in a higher on-current $I_{on}$ and thus in an improved subthreshold swing for a given off-current $I_{off}$.

However no manufacturable process flow has been disclosed for manufacturing TFET devices having a high on-current Ion, a low leakage current Ioff and a subthreshold swing less than 60 mV/dec.

SUMMARY OF THE INVENTION

There is a need for methods to manufacture such TFET devices which overcome the disadvantages mentioned above for state of the art TFETs.

It is an object of certain embodiments to provide a method for manufacturing a tunnel Field Effect transistor (TFET) with good device properties; in particular a TFET with improved performance thereby reducing the average subthreshold swing below 60 mV/dec corresponding to a high $I_{on}$ and low $I_{off}$ even at reduced power supply voltage. The on-current $I_{on}$ is preferably above 100 micro-ampere/micrometers (μA/μm) while the off-current $I_{off}$ is preferably below 1 nano-ampere (nA/μm). The supply voltage is preferably 1 V or less.

It is an object of certain embodiments to provide a method for manufacturing such a TFET comprising cost-effective and easy process steps which can be applied in the manufacturing for different types of TFET devices such as for example: vertical or horizontal TFETs, homo- or heterostructure TFET, NanoWire-based TFET devices (NW-TFET), and the like.

It is an object of certain embodiments to provide a TFET with a subthreshold swing below 60 mV/dec a high $I_{on}$ and low $I_{off}$ even at reduced power supply voltage.

The above objectives are accomplished by methods and devices according to embodiments described herein.

Particular and preferred aspects of the embodiments are set out in the accompanying independent and dependent claims. Features from the dependent claims may be combined with features of the independent claims and with features of other independent claims as appropriate and not merely as explicitly set out in the claims.

An aspect is related to a method for manufacturing a tunnel field effect transistor (TFET). The method comprises providing a drain region in a semiconductor substrate, providing a channel region in the semiconductor substrate in contact with the drain region thereby forming a drain-channel interface with the drain region, providing a source region in contact with the channel region thereby forming a source-channel interface with the source region having a highly doped source-channel interface. Preferably the source-channel interface locally protrudes into the channel region.

Providing the source region comprises providing a metal layer in contact with the channel region offset from the drain-channel interface, forming from the metal layer and from part of the semiconductor channel region in contact with the metal, a metal-semiconductor alloy, preferably protruding into the channel region thereby forming the shaped source-channel interface having at least one tip along the source-channel interface. The metal-semiconductor alloy comprises metal material from the deposited metal layer and semiconductor material from the channel region and further also comprises a highly doped shaped semiconductor layer at the shaped source-channel interface.

The thickness of the interface layers 5,6 is typically between and including 100 nm to 5 nm, preferably between and including 15 nm and 5 nm.

This interface layer 5 has a concentration at least higher than $1e19/cm^3$, preferably higher than $1e20/cm^3$. This interface layer 6 has a concentration gradient between 10 nm/dec to 1 nm/dec, preferably 5 nm/dec indicating the concentration drops with 1 decade per 5 nm.

The shaped metal-semiconductor alloy forms very sharp interfaces with the surrounding semiconductor material, i.e. with abrupt transitions from the metal-semiconductor alloy to semiconductor channel region. The shape of the metal-semiconductor alloy preferably follows particular crystal planes of the semiconductor material of the channel region such that a pyramidal shape is obtained. The shape of the source-channel junction is determined by the crystalline orientation of the semiconductor material of the channel region as the metal-semiconductor alloy will grow anisotropically in a crystal-orientation dependent way.

The shape of the metal-semiconductor alloy is preferably a tip shape or a wedge shape. Thus the shaped metal-semiconductor alloy is preferably a tip-shaped or wedge-shaped metal-semiconductor alloy protruding into the channel region thereby respectively forming a tip-shaped or wedge-shaped source-channel interface whereby the interface is at an angle with the surface of the gate in contact with the channel region.

The metal is selected from the group of metals which forms a eutectic system with the semiconductor material. Preferably this eutectic system results in a tip-shaped or wedge-shaped alloy within the semiconductor material. This metal can also be a dopant of the semiconductor material. Preferably this metal can be doped with a dopant of the semiconductor material. An example of such a material combination is Aluminum and Silicon, whereby Boron, being a p-type dopant for Silicon, can be introduced into the Aluminum.

The method for manufacturing a TFET may further comprise, at least partly, removing the metal-semiconductor alloy without removing the highly doped shaped semiconductor layer thereby leaving an opening. The method can further comprise providing a source contact on the highly doped shaped semiconductor layer in the opening. Preferably the opening is pyramidal shaped.

According to certain embodiments, forming the shaped metal-semiconductor alloy comprises performing a heat treatment, causing the metal to interact with the semiconductor material to form an eutectic alloy thereby creating the shaped source-channel interface, and thereafter cooling down, thereby solidifying the shaped source-channel interface resulting in the formation of highly doped semiconductor layers 5,6 sandwiched between the alloy 12 and the original semiconductor material 7.

According to embodiments, the metal layer is preferably doped with a dopant which dopant, after the formation of the alloy, will be present in the highly doped sandwiched semiconductor layers 5,6.

The thickness of the metal layer may range from a few nanometers, for example 10 nm, up to 1 micrometer.

The metal layer may be provided using techniques such as sputtering, chemical vapor deposition, evaporation, screen printing, and the like.

The metal content in the alloy is limited by the solubility of the metal in the semiconductor material. For example, when Aluminum (Al) is used as metal material, the Al-content in the alloy layer is limited by the solubility of Al in Si, which implies that it maximally amounts to about $10^{19}$ at/$cm^3$.

The concentration of the dopant, which may be added to the metal layer, should be maximized, as to reach the solubility limit of the dopant in the semiconductor material. This solubility limit typically correspond to a few times $10^{20}$ at/$cm^3$. This is considered a very high doping in TFET. For example the metal layer may be doped with Boron (B), which implies that the concentration of B in this metal layer should be increased to reach the solubility limit of Boron in the semiconductor (Si), which typically corresponds to a few times $10^{20}$ at/$cm^3$.

The concentration of the dopant in the semiconductor material can be lower than in the doped metal material providing the dopants.

Preferable, but non-limiting, metal-semiconductor combinations for use in certain embodiments include Al—Si or Al—Ge, wherein the Aluminum is doped with for example Boron.

According to various embodiments, a method for manufacturing a tunnel field effect transistor is disclosed, the method comprising: forming a drain region, forming a source region, forming a channel region comprising a semiconductor material in between the source region and the drain region, the interface between the source region and the channel region being preferably shaped, more preferably being tip-shaped or wedge-shaped, and the interface between the drain region and the channel region being preferably planar, forming a gate stack, comprising a gate dielectric and a gate electrode, which gate stack at least contacts part of the channel region, wherein forming the source region comprises: depositing a metal layer, preferably an Aluminum layer, on part of the semiconductor material of the channel region, forming a shaped metal-semiconductor alloy between deposited metal and semiconductor material of the channel region, the metal-semiconductor alloy protruding into the channel region thereby forming the shaped source-channel interface comprising a highly doped semiconductor layer in the source region, at least partly removing the metal-semiconductor alloy without removing the highly doped semiconductor layer thereby leaving an tip-shaped opening, and providing a source contact in the tip-shaped opening.

In case of a method for forming a horizontal TFET semiconductor device, depositing the metal layer on part of the channel region further comprises providing an opening in the semiconductor layer offset from the channel-drain interface and filling the opening with metal of the metal layer.

The embodiments are applicable to all types of TFET implementations, including but not limited to planar TFETs, double-gate TFETs, tri-gate TFETs such as like FinFETs, and all-around TFETs, horizontal and vertical TFET implementations, including implementations with a bulk contact and without a bulk contact.

The embodiments are furthermore applicable to all TFETs independent of the type of channel doping, including p-type channel doping, n-type channel doping and intrinsic doping.

The embodiments are furthermore applicable to all TFET implementations, independent of the semiconductor material used as source material, as channel material and as drain material, including TFETs with a source material which is different from the channel material and/or which is different from the drain material, including TFETs with a drain material which is different from the channel material. Possible semiconducting materials are including but not limited to group IV materials such as Si, Ge, C or binary compounds thereof, or group III/V materials such as In, Ga, As, Sb, Al, P, B, N or binary, tertiary or quaternary compounds thereof or group II/VI materials such as Cd, Zn, S, Se, Te, O or binary, tertiary or quaternary compounds thereof, or carbon nanotubes.

The embodiments are furthermore applicable to all TFET implementations, independent of the gate dielectric material and thickness. Possible gate dielectric materials are. including but not limited to, silicon based oxides e.g. silicon dioxide, silicon oxy nitride, aluminum oxide, high-k oxides such as oxides, nitrided oxides, silicates and nitrided silicates of transition metals such as Hf, Ta, Ti, Nb, V, Y, or Zr.

The above and other characteristics, features and advantages of the embodiments will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

The high performance achieved for TFET devices according to certain embodiments is an advantage compared to state-of-the-art TFET devices. In particular the high performance refers to a very high on-current and a steep subthreshold swing, i.e. less than 60 mV/dec, which allows decreasing the power supply voltage, and hence allowing for a low-power device such that scaling of the transistor can be continued beyond the capabilities of the MOSFET.

DESCRIPTION OF THE DRAWINGS

The drawings described are only schematic and are non-limiting. In the drawings, the size of some of the elements may be exaggerated and not drawn on scale for illustrative purposes. The dimensions and the relative dimensions as depicted in the figures should not be considered limiting to the embodiments.

TABLE 1

Overview of Reference Numbers Used

Figure 1:
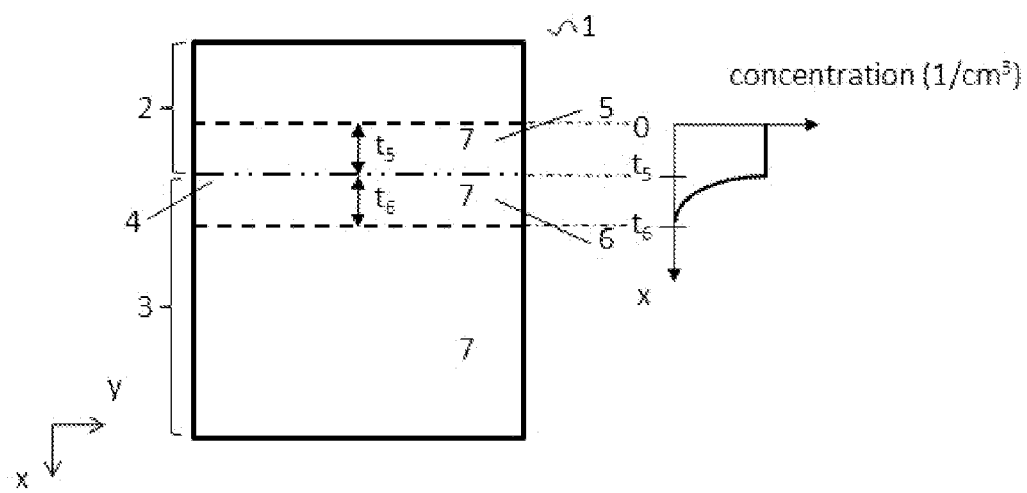
FIGS. 1-5 illustrates various embodiments.

| 1 | tunnel Field Effect Transistor | 2 | Source |
| 3 | Channel | 4 | Interface between source and channel |
| 5 | Source side interface layer | 6 | Channel side interface layer |
| 7 | first crystalline semiconductor material | 8 | Protrusion towards channel |
| 9 | Layer of second crystalline semiconductor material | 10 | Second crystalline semiconductor material |
| 11 | Metal | 12 | Alloy of metal 11 and first crystalline semiconductor material 7 |

TABLE 1-continued

Overview of Reference Numbers Used

| 13 | layer of alloy 12 | 14 | layer of metal 11 |
| 15 | source electrode | 16 | drain |
| 17 | gate dielectric | 18 | gate electrode |
| 19 | drain electrode | 20 | trench |

DETAILED DESCRIPTION OF THE PREFERRED EMBODIMENTS

The invention will be described with respect to particular embodiments and with reference to certain drawings but the invention is not limited thereto but only by the claims.

Moreover, the term top and the like in the description and the claims are used for descriptive purposes and not necessarily for describing relative positions. It is to be understood that the terms so used are interchangeable under appropriate circumstances and that the particular embodiments described herein are capable of operation in other orientations than described or illustrated herein.

It is to be understood that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to that particular embodiment, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art, in one or more embodiments.

Similarly it should be appreciated that in the description of exemplary particular embodiments, various features are sometimes grouped together in a single embodiment, figure, or description thereof for the purpose of streamlining the description and aiding in the understanding of one or more of the various aspects. This method of describing the various embodiments, however, is not to be interpreted as reflecting an intention that the invention as claimed requires more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that particular embodiments may be practiced without these specific details. In other instances, well-known methods, structures and techniques have not been shown in detail in order not to obscure an understanding of this description.

The invention will now be described by a detailed description of several particular embodiments. It is clear that other particular embodiments can be configured according to the knowledge of persons skilled in the art without departing from the technical teaching of the invention as defined by the appended claims.

All figures are intended to illustrate some aspects and certain embodiments. The figures are depicted in a simplified way for reason of clarity. Not all alternatives and options are shown and therefore the invention is not limited to the content of the given drawings. Like numerals are employed to reference like parts in the different figures.

When referring to the term tunneling field effect transistor (TFET) through the text, reference is made to a semiconductor device in which the gate controls the source-drain current through modulation of the so-called Band-To-Band Tunneling (BTBT). Band-to-band tunneling is a physical mechanism in which electrons tunnel from the valence band through the semiconductor bandgap to the conduction band or vice versa. A TFET comprises typically a source-channel-drain configuration wherein the source and drain region are oppositely doped, i.e. for example the source region is p-type doped whereas the drain region is n-type doped or vice versa. The channel region is lower doped or undoped.

While some embodiments described herein include examples of a double-gate TFET device, more specifically a TFET device comprising a horizontal source-channel-drain structure and a double gate electrode situated at least on the sidewalls of the channel region of the horizontal source-channel-drain structure, also other implementations of TFET devices may be applied such as for example a tri-gate TFET, an all-round gate TFET, a nanowire TFET, or the like. A tri-gate TFET comprises a horizontal source-channel-drain structure and a triple gate electrode situated on the sidewalls and on top of the channel and/or source region of the horizontal source-channel-drain structure. An all-around TFET comprises a horizontal or a vertical source-channel-drain structure and an all-around gate electrode situated around the channel and/or source region of the horizontal or vertical source-channel-drain structure. A nanowire TFET comprises a nanowire which forms at least the channel region and an all-around gate electrode structure around the channel and/or source region of the nanowire TFET. More specifically the fabrication method relates to but is not limited to standard planar technology, double gate technology, FinFET technology and nanotechnology, wherein the latter includes implementations with integrated nanowires.

While some embodiments described herein include examples of a nTFET, which means the semiconductor device comprises a p-type source, a channel contacted by a gate electrode, and a n-type drain, such a nTFET being often referred to as a p-i-n diode TFET, also other implementations of TFET device may be applied such as for example a pTFET, which means the semiconductor device comprises an n-type source, a channel contacted by a gate electrode, and a p-type drain.

Whenever reference is made hereinafter to a particular dopant type, this is done for the ease of explanation only and is not intended to limit the various embodiments. It is to be understood that in the examples given herein below, materials and dopant types may be replaced by other suitable materials and dopant types, without changing the scope of the invention.

FIGS. 1-5 illustrate various embodiments by means of schematic cross sections.

FIG. 1 shows a Tunnel Field Effect Transistor comprising an interface 4 between a source 2 and a channel 3, the source side of this interface 4 being a layer 5 of a first crystalline semiconductor material 7 substantially uniformly doped with a metal 11 to the solubility level of the metal 11 in the first crystalline material 7 and the channel side of this interface 4 being a layer 6 of this first crystalline semiconductor material doped with this metal 11, the concentration thereof decreasing towards the channel.

Optionally, the source side interface layer 5 is substantially uniformly doped with another dopant at a concentration level $N_5$ and the channel side interface layer 6 is then doped with this other dopant, the concentration thereof decreasing from this concentration level $N_5$ towards the channel 3.

Typically the source side interface layer 5 has a thickness $t_5$ between 5 nm and 100 nm and a concentration level $N_5$ of at least $1e19/cm^3$. The channel side interface layer 6 has typically a thickness $t_6$ between 5 nm to 100 nm and a concentration gradient between 10 nm/dec to 1 nm/dec.

The plane of the interface 4 is preferably a {111} plane. In FIG. 1 the interface 4 is substantially planar, in which case the {111} plane is lying in the y-z plane parallel to the substrate. FIG. 1 illustrates a vertical type Field Effect Transistor.

Figure 2:
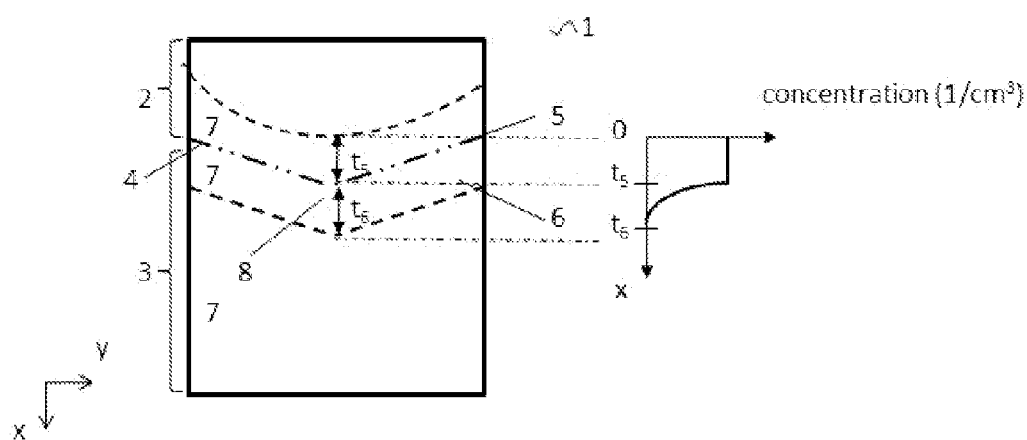
Figure 3:
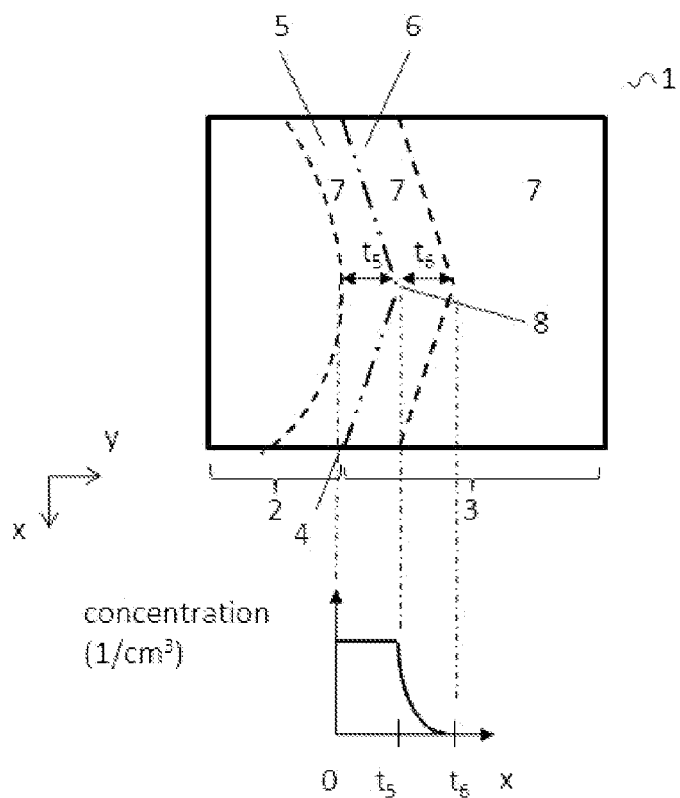

However, as illustrated by FIG. 2, the interface 4 can protrude 8 towards the channel 3 thereby forming a pyramidal-like structure into the channel 3. The sidewalls of this protrusion 8 form the interface 4 and are lying in a {111} plane. FIG. 2 shows a vertical type of a Field Effect Transistor 1 wherein the interface 4 protrudes into the channel 3 along the x direction. FIG. 3 shows a horizontal type of such a Field Effect Transistor 1 wherein the interface 4 protrudes into the channel 3 along the y direction.

Figure 4:
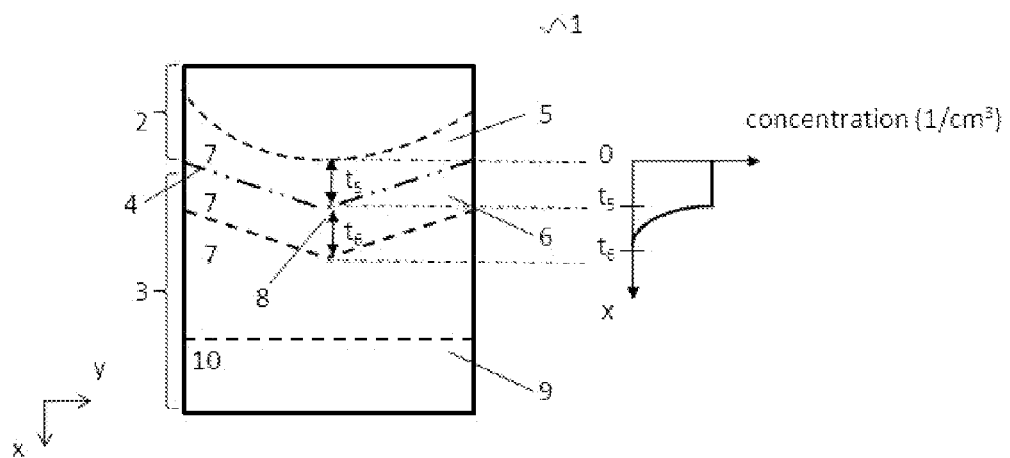

In the tunnel Field Effect Transistors 1 illustrated by FIGS. 1 to 3, the source 2 and channel 3 are formed from the same crystalline semiconductor material 7. Such a TFET is known as homostructure TFET. As illustrated by FIG. 4, the channel 3 can further comprises a layer 9 of a second crystalline semiconductor material 10 adjacent to the channel side interface layer 6 resulting in a heterojunction between the first crystalline semiconductor material 7 and the second crystalline semiconductor material 10. Such a TFET is known as heterostructure TFET.

Figure 5:
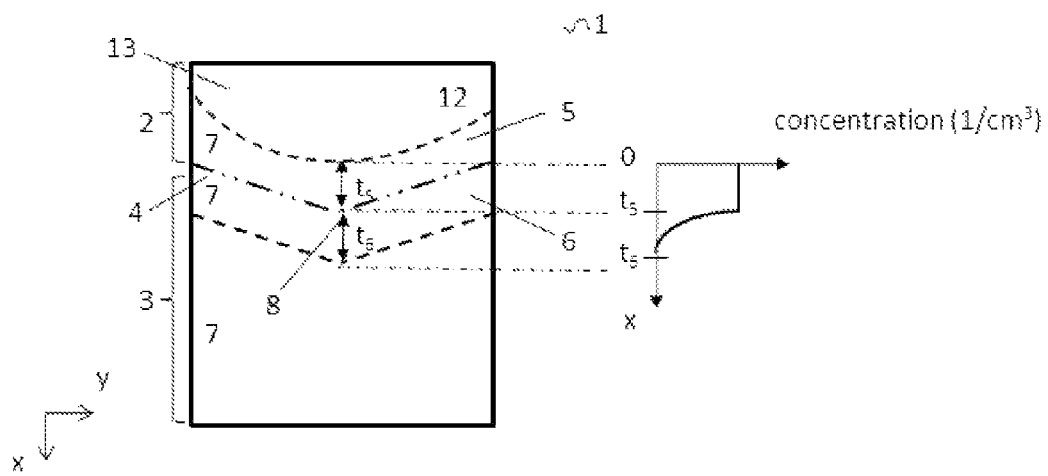

As shown by FIG. 5, the source 2 of the tunnel Field Effect Transistors 1 illustrated by FIGS. 1 to 4 can further comprise a layer 13 of an alloy 12 of the first crystalline semiconductor material 7 and the metal 11, the alloy layer 12 contacting the source side interface layer 5.

Preferably, the first crystalline semiconductor material 7 is $Si_xGe_{1-x}$ with $0 \leq x \leq 1$. Preferably the metal 11 is Aluminum. If this Aluminum 11 is doped, preferably this other dopant is Boron.

In an aspect, methods for manufacturing the source-channel interface of a tunnel field effect transistor are provided.

For the purpose of teaching, embodiments will now be described for a vertical TFET structure.

FIGS. 6a to 6j show schematic representations of the top view and corresponding schematic representations of the cross-section AA of a vertical TFET structure during different manufacturing steps comprising a pyramidal shaped source region 3 according to certain embodiments.

First a substrate is provided. Preferably this substrate is a crystalline semiconductor substrate such as a silicon substrate or a semiconductor on insulator (SOI) substrate but any other suitable substrate supporting a crystalline semiconductor layer 7 can be used as well such as, for example, glass, ceramics, etc.

Figure 6A:
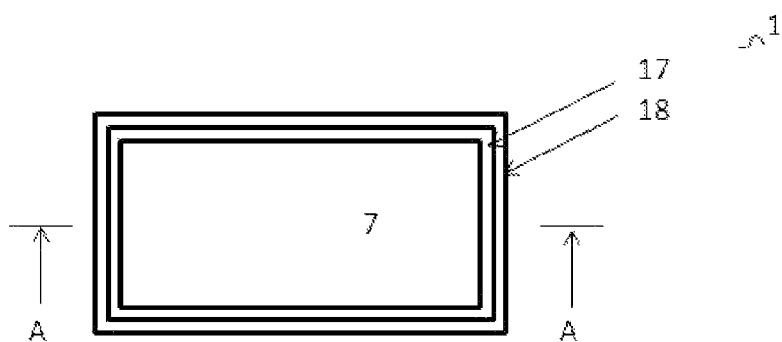
FIGS. 6*a-j* illustrates by means of schematic top views and corresponding cross sections A-A a method of manufacturing of a vertical tunnel FET manufactured according to embodiments.
Figure 6B:
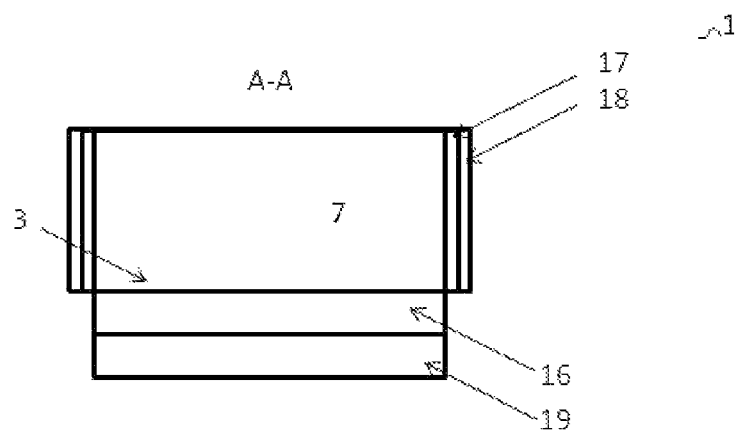

According to methods known for a person skilled in the art, a drain 16 and channel 3 are provided on the semiconductor substrate as shown in FIGS. 6a and 6b. The channel region 3 is in contact with the drain 16. For example, the drain 16 and the channel 3 may be formed by epitaxial growth of semiconductor material 7,10 of the channel 3 and drain 16 on the semiconductor substrate or layer. Alternatively nanostructures may be etched from an undoped substrate after which the bottom region of the thus formed nanostructure is implanted thereby forming the doped drain 16.

The drain region 16 may be made of a semiconductor material which is highly n-doped in case of an n-type TFET, or alternatively in case of a p-type TFET the drain 16 is highly p-doped. In certain embodiments, the doping level of the drain 16 is typically in the range of $1e18/cm^3$ to $1e21/cm^3$, for example in the range of $1e19/cm^3$ to $5e20/cm^3$.

In certain embodiments, the channel 3 can be made of a semiconductor material 7, 10 which is the same or different from the semiconductor material of the drain 16, thereby forming respectively a homojunction or heterojunction between the channel 3 and the drain 16. The channel 3 is preferably undoped or lower doped. In certain embodiments, the doping level of the channel 3 may be in the range of undoped up to $1e17/cm^3$ doping, for example in the range of undoped up to $1e15/cm^3$ doping.

According to certain embodiments, a gate comprising a gate dielectric 17 and gate electrode 18 is provided as shown in FIGS. 6a and 6b. The gate, more specifically the gate dielectric 17 of the gate 10, is at least in contact with the channel 3 of the TFET device 1.

According to particular embodiments, the crystalline semiconductor substrate has a [100] orientation. Then a shaped source 2 is provided in contact with the channel 3 as such forming a tip-shaped source-channel interface 4 between the source 2 and the channel 3. Otherwise said, the interface 4 between the source 2 and the channel 3 is not a plane but has a tip-like 8 shape. With tip-like shape is meant that the source 2 has a pyramidal shape with the tip extending 8 into the channel 3 or that the source 2 has a knife-edged shape with the knife edge extending 8 into the channel 3 or that the source 2 has a conical shape with an apex extending 8 into the channel 3 or that the source 2 has a conical shape with a knife-edge apex extending 8 into the channel 3.

Depending on the shape of contact area between the layer 14 of the alloying metal 11 and the source 2, the alloy formed 12 may be pyramidal shaped or knife-edge shaped resulting in a shaped source 2. FIGS. 6e and 6f illustrate a pyramidal shaped source region 3 having 1 apex. The contact area between the metal layer 11 and the source region 3 was square. FIGS. 6g and 6h illustrate a knife-shaped source region having 2 apexes. Here the contact area between the metal layer 11 and the source region 3 was rectangular.

According to certain embodiments, the channel 3, after the step of providing a channel 3 in contact with the drain 16, has a cuboid shape with a rectangular top surface which is substantially parallel to the semiconductor substrate surface plane. The sidewalls of the cuboid channel are substantially orthogonal oriented with respect to the semiconductor substrate surface plane. A channel having a cuboid shape with a rectangular top surface is also referred to as a rectangular cuboid channel 2.

According to certain embodiments, the channel 3, after the step of providing a channel 3 in contact with the drain 16, has a cuboid shape with a square top surface which is substantially parallel to the semiconductor substrate surface plane. The sidewalls of the cuboid channel are substantially orthogonal oriented with respect to the semiconductor substrate surface plane. A channel 3 having a cuboid shape with a square top surface is also referred to as a square cuboid channel.

According to certain embodiments, the channel 3, after the step of providing a channel 3 in contact with the drain 16, has a cylindrical shape with an elliptical top surface which is substantially parallel to the semiconductor substrate surface plane. The curved sidewall of the cylindrical channel is substantially orthogonal oriented with respect to the semiconductor substrate surface plane. A channel 3 having a cylindrical shape with an elliptical top surface is also referred to as an elliptic cylindrical channel.

According to certain embodiments, the channel 3, after the step of providing a channel 3 in contact with the drain 16, has a cylindrical shape with a circular top surface which is substantially parallel to the semiconductor substrate surface plane. The curved sidewall of the cylindrical channel 3 is substantially orthogonal oriented with respect to the semiconductor substrate surface plane. A channel 3 having a cylindrical shape with a circular top surface is also referred to as a circular cylindrical channel.

In the case of a rectangular cuboid channel 3, the source 2 will be knife-edge pyramidal shaped.

In the case of a square cuboid channel 3, the source 2 will be pyramidal shaped.

In the case of an elliptic cylindrical channel 3, the source 2 will be knife-edge shaped, wherein the dimensions of the ellipse will determine the length and width of the shape.

In the case of a cylindrical channel 3, the source 2 will be pyramidal shaped.

FIGS. 6a and 6b shows a tunnel FET 1 comprising a square cuboid channel 3 in contact with a drain 16 on a drain electrode 19. On the channel 3, a gate stack is provided comprising a gate dielectric 17 and a gate electrode 18.

The step of providing a source 2 in contact with the channel 3 as such forming a tip-shaped source-channel interface 4 with the channel 3 comprises different sub-steps.

Figure 6C:
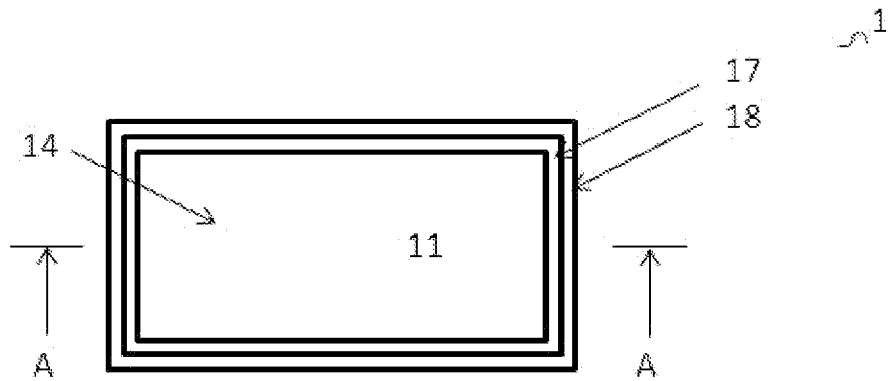
Figure 6D:
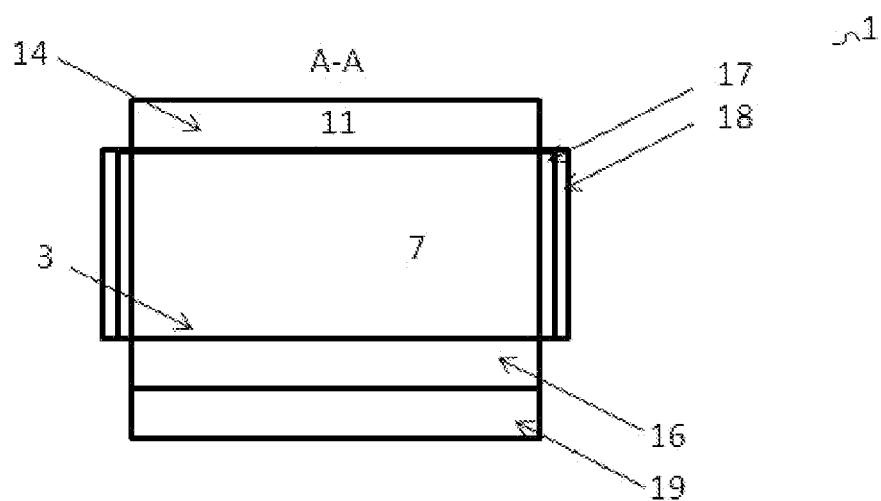
Figure 6E:
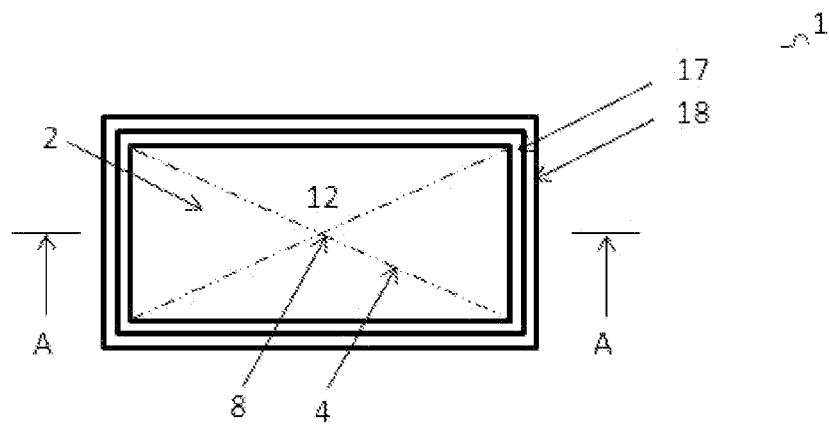
Figure 6F:
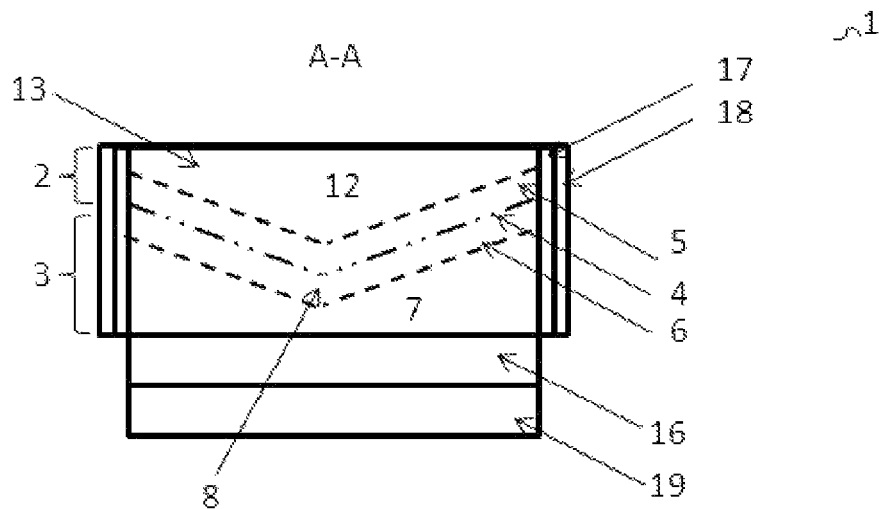
Figure 6G:
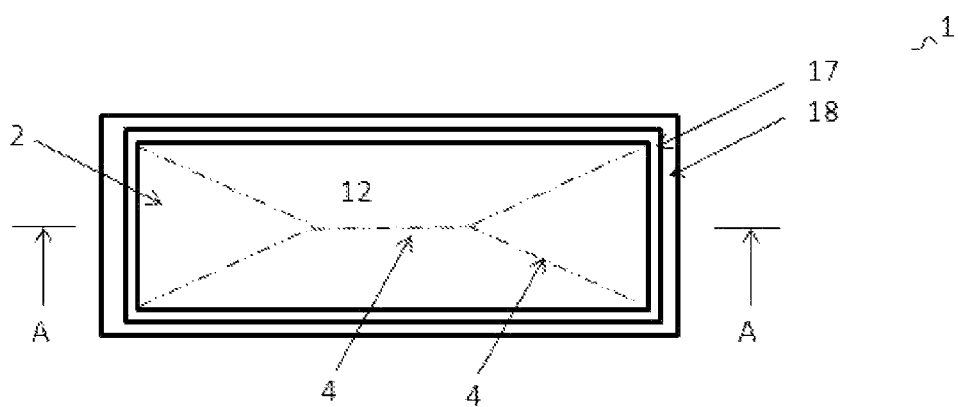
Figure 6H:
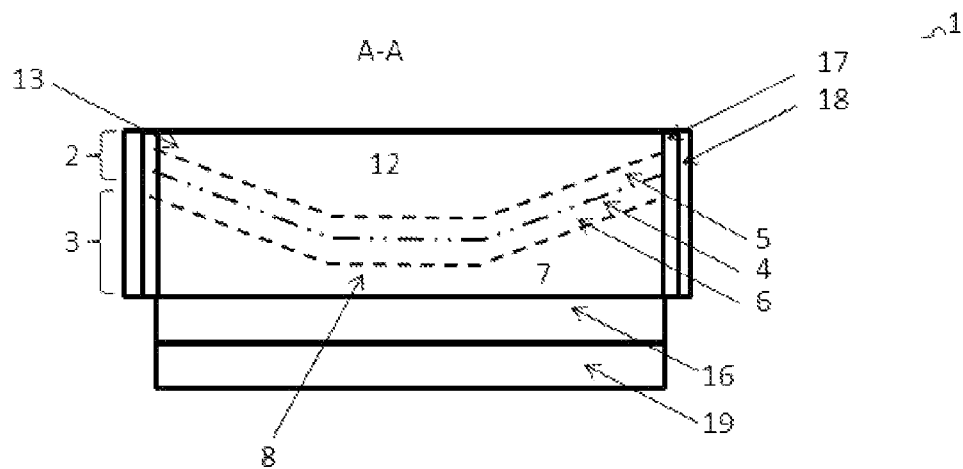

As shown in FIGS. 6b and 6c a layer 14 of a metal 11 is provided on top of the first crystalline semiconductor material 7 in which the source 2 and the channel 3 are to be formed. The metal layer 14 preferably consists of an Aluminum layer. The metal layer 14 is provided on the surface of the crystalline semiconductor material 7 of the channel 3 which is exposed after the step of providing the channel 3. Providing the metal 11 may comprise depositing a metal layer 14 over the whole structure, i.e. the channel 3 and gate stack 17-18, and patterning the metal layer 14 such that the metal 11 remains only present on top of the channel 3 and in contact with the first crystalline semiconductor material 7. The metal layer 14 may be deposited using physical vapor deposition (PVD) or sputtering, chemical vapor deposition, screen printing, or the like. The thickness of the as-deposited metal layer 14 is in the range of 10 nm up to 1 micrometer.

According to embodiments a doped metal layer 14 may be provided in contact with the channel 3. The metal 11 of layer 14 may be doped with a p-type dopant, such as for example Boron. The metal 11 may be doped with an n-type dopant, such as for example As. For example a doped Aluminum layer may be provided. The Aluminum layer may be doped with a p-type dopant, such as for example Boron, resulting in an Al—B layer. The Aluminum layer may be doped with an n-type dopant, such as for example As, resulting in an Al—As layer. The dopant of the metal 11 is selected in view of the dopant level and dopant type of the interface layers 5, 6 that are to be formed as will be discussed further on.

If a source-channel interface 4 with a tip 8 is to be formed, the metal 11 must consist of a material which has a self-formation of a shape, e.g., tip or wedge-shape, in the host lattice, i.e., first crystalline semiconductor material 7, upon alloying, i.e., heat treatment and cooling down, and which may be, but not necessarily is a dopant of the host lattice. The metal layer is selected to form a semiconductor alloy in an anisotropic way. For example for a Si channel region the following p-type dopants may be used: B, Al, Ga, In, Tl, Pd, Na, Be, Zn, Au, Co, V, Ni, MO, Hg, Sr, Ge, Cu, K, Sn, W, Pb, O, or Fe. For example for a Si channel region the following n-type dopants may be used: Li, Sb, P, As, Bi, Te, Ti, C, Mg, Se, Cr, Ta, Cs, Ba, S, Mn, Ag, Cd, or Pt. For example for a Ge channel region the following p-type dopants may be used: B, Al, Tl, Ga, In, Be, Zn, Cr, Cd, Hg, Co, Ni, Mn, Fe, or Pt. For example for a Ge channel region the following n-type dopants may be used: Li, Sb, P, As, S, Se, Te, Cu, Au, or Ag.

After providing the metal 11, a shaped metal-semiconductor alloy 12 is formed as shown in FIGS. 6e and 6f for a tip-shaped alloy 12 or FIGS. 6g and 6h for a wedge-shaped alloy 12. The tip-shaped metal-semiconductor alloy 12 comprises metal material from the as-deposited metal 11 and first crystalline semiconductor material 7 from the semiconductor channel 3 and also comprises a tip-shaped highly doped semiconductor layer 5 at the tip-shaped source-channel interface 4, the tip-shaped metal-semiconductor alloy 12 protruding 8 towards and penetrating into the channel 3 thereby forming the tip-shaped source-channel interface 4.

Forming the metal-semiconductor alloy 12 comprises performing a heat treatment and thereafter cooling down. The maximum temperature at which the heat treatment is performed may depend on the first crystalline semiconductor material 7. For silicon 7 the heat treatment is at least at 650° C., typically at 800° C., but can be higher than 800° C. For Germanium 7 the heat treatment is at least at 450° C. but can be higher. A rapid thermal annealing step may be used for example. For example an Al—Si (12-7) alloy may be formed by first heating the structure comprising the as-deposited Aluminum 11 on top of the Si 8 channel 3. During this heating step the first crystalline semiconductor material 7, i.e. the silicon 7 from the channel 3 will dissolve into the Aluminum 11. When the Al—Si (11-7) dissolved structure is then cooled down, several layers are formed, more specifically an Al—Si matrix layer (replacing the as-deposited Aluminum 11 layer 14) in contact with an Al—Si alloy 12 (which penetrates into the original silicon channel 3). This Al—Si alloy 12 contacts a thin layer 5 being a highly metal 11 doped crystalline semiconductor layer 5 at the interface 4 and a lower metal doped crystalline semiconductor layer 6 at the opposite side of the interface 4. During the step of cooling down the doped semiconductor layers 5 and 6 are formed first. The remaining liquid solidifies at the eutectic temperature leading to the Al—Si alloy 12. The rest of the material forms a matrix layer of Al—Si particles. During the cooling down the Al concentration near the source-channel interface 4 is reduced leaving a highly doped semiconductor source side interface layer 5 and a lower doped semiconductor channel side interface layer 6.

Due to the fact that the alloy 12 formation starts from a square-like contact area, the resulting metal-semiconductor alloy 12 and doped semiconductor layers 5,6 formed at the surface of this metal-semiconductor alloy 12 has a pyramidal shape with the point of the pyramid protruding 8 towards the channel 3. The pyramidal shape is due to the different dissolution speeds which occur at different crystallographic planes, for example at the {100} and {111} planes.

In "Local Al-alloyed contact for next generation Si solar cells" from Uruena et al. as published on the 24$^{th}$ European Photovoltaic Solar Energy Conference, September 2009, the thermodynamics which lies behind the Al—Si alloy formation, more specifically the physical mechanism of the formation of so called Al-BSF, is described in more detail, hereby incorporated by reference.

The resulting structure after forming the metal-semiconductor alloy is schematically shown in FIGS. 6e and 6f in case of a square cuboid channel 3. After a heat treatment and cooling down of the structure, a tip-shaped source 2 is formed, the tip-shaped source 2 comprising a tip-shaped highly doped semiconductor interface layer 5 at the channel-source interface 4 and a tip-shaped metal semiconductor alloy 12 in contact with the tip-shaped highly doped semiconductor interface layer 5. The tip-shaped source 2 is protruding 8 in the as-formed channel 3, such that the apex or end point of the tip-shaped source 2 is located in the as-formed channel 3. The resulting channel 3 becomes thus smaller than the as-formed channel 3 due to the penetration of the metal-semiconductor alloy 12 into the channel 3 and formation of the highly doped semiconductor interface layer 5 from the tip-shaped source region 3. Optionally a source electrode 15 can be formed on the alloy 12.

Figure 6I:
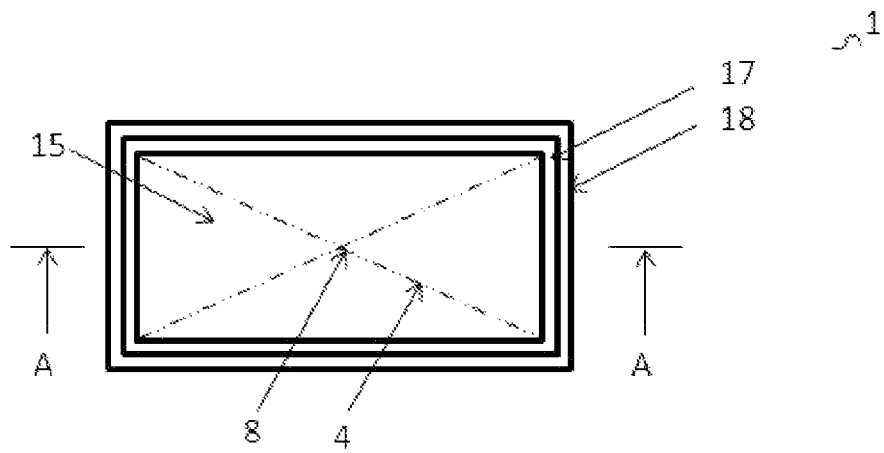
Figure 6J:
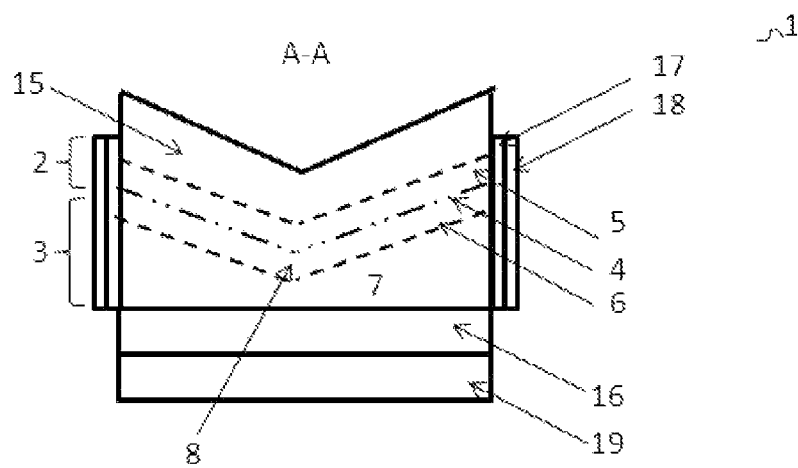

Alternatively, according at least part or the complete semiconductor-metal alloy 12 may be removed. FIGS. 6i and 6j show a schematic representation of the resulting structure after removal of the semiconductor-metal alloy 12 and formation of the source electrode 15. The tip-shaped source 2 then consists of the highly doped semiconductor layer 5. Additionally part of the metal-semiconductor alloy 12 may still be present or may be removed completely. By removing the metal-semiconductor alloy 12 a tip-shaped opening is formed. The tip-shaped opening may be filled completely or partially with a source contact material as shown in FIGS. 6i and 6j. Otherwise said on top of the tip-shaped source 2, i.e. highly doped semiconductor layer 5, a source electrode 15 may be formed.

Due to the self-formation of the source 2 comprising the highly doped semiconductor layer 5 a very sharp transition in doping level is formed from the highly doped source 2 toward the lower doped channel 3. Depending on the crystal orientation of the semiconductor substrate, this source 2 also comprises a tip extending 8 towards the channel 3. Otherwise said, an abrupt interface 4 may be formed between the source 2 and the channel 3 of the TFET structure 1.

Figure 7:
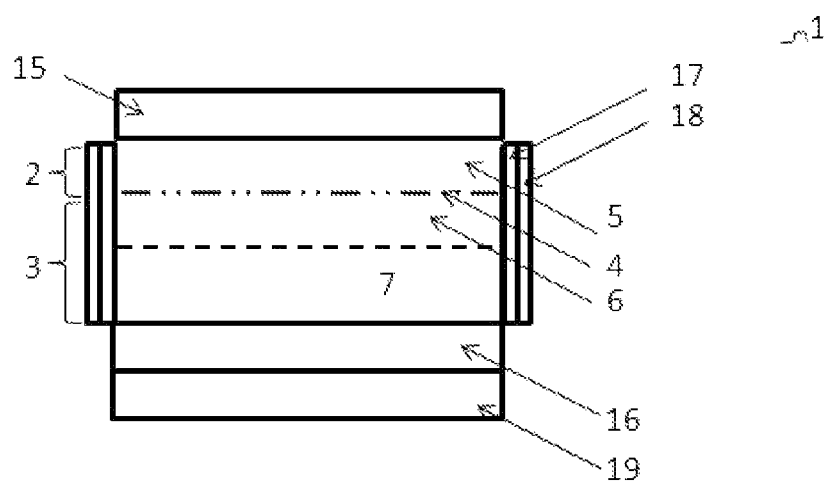
FIG. 7 show a schematic cross section of a vertical heterostructure tunnel FET according to an embodiment.

FIG. 7 illustrates a vertical tunnel FET where a highly doped source side interface layer 5 is formed at the interface 4 between the source 2 and the channel 3. Here the source 2 is flat without an apex pointing 8 towards the channel 3. Whereas in the previous embodiments, for the purpose of description, a silicon substrate having a [100] crystal orientation was chosen, here a silicon substrate having a [111] crystal orientation is chosen for illustrating this embodiment having a planar interface 4. If Aluminum 11 is deposited on the channel 3, a metal-semiconductor alloy 12 is formed when heating up and cooling down the substrate. Due to the [111] crystal orientation the Al—Si alloy 12 will grow uniformly into the first crystalline semiconductor substrate 7 resulting in a planar interface 4. As discussed above, also here the alloying metal 11 can be doped; either during providing this metal 11 or afterwards using ion implantation. In this embodiment, the semiconductor alloy 12 is completely removed and an additional source electrode 15 is contacting this highly doped source side interface layer 5. The semiconductor alloy 12 was formed by the interaction between the metal 11 provided to crystalline semiconductor material 7 wherein the channel 3 is to be formed.

Examples of different embodiments are illustrated in FIGS. 8a-8h, showing schematic top views and corresponding cross sections A-A, describing methods for manufacturing a horizontal TFET structure with a shaped source-channel interface 4.

FIGS. 8a-8h show different steps of the top view and corresponding cross-sectional view AA of a horizontal TFET device manufactured according to certain embodiments.

Figure 8A:
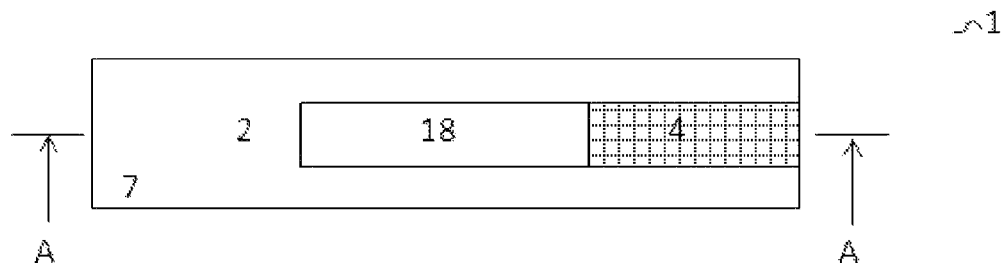
FIGS. 8*a-h* illustrates by means of schematic top views and corresponding cross sections A-A a method of manufacturing of a horizontal tunnel FET manufactured according to embodiments.
Figure 8B:
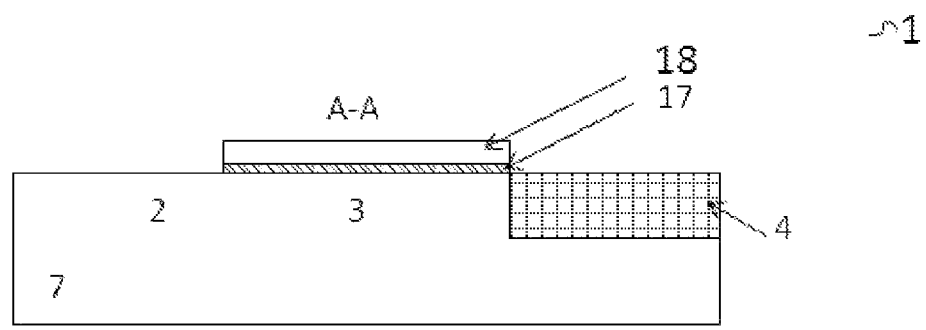

FIG. 8a and FIG. 8b schematically show a semiconductor 7 substrate wherein a drain 16 and gate stack 17, 18 are formed. The location of the source 2 is indicated.

Figure 8C:
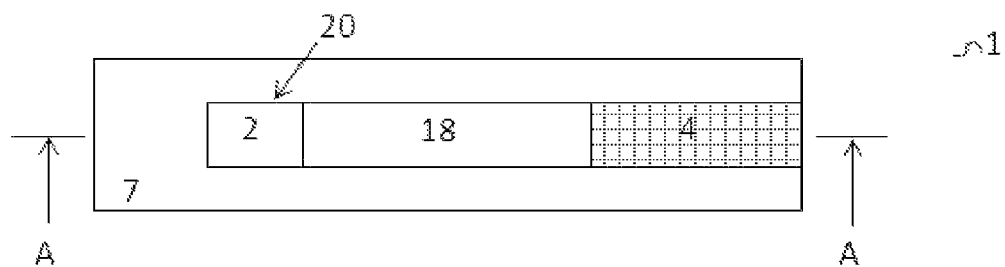
Figure 8D:
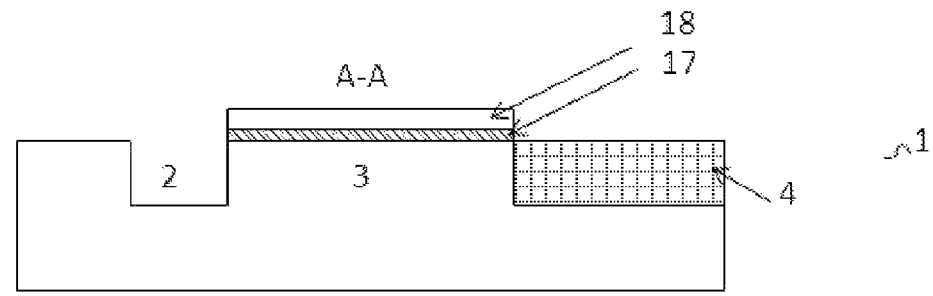
Figure 8E:
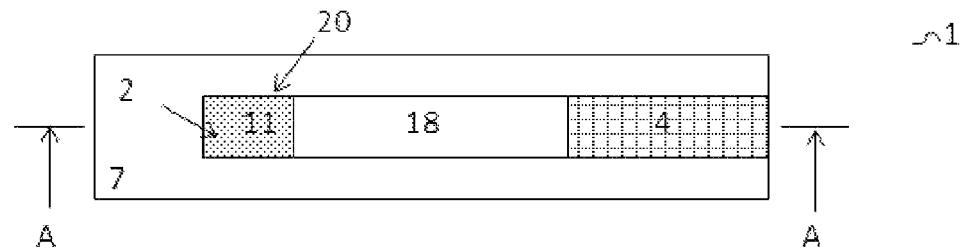
Figure 8F:
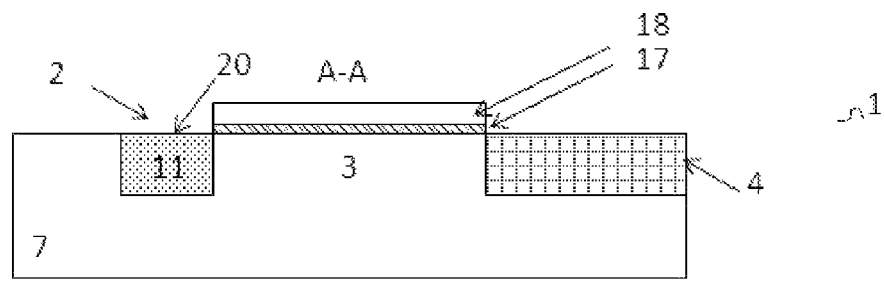

FIG. 8c and FIG. 8d schematically show providing an opening 20 in semiconductor 7 substrate at the location of the source 2. This opening 20 is thereafter filled with the alloying metal 11 as shown in FIGS. 8e and 8f. The opening is a square.

Figure 8G:
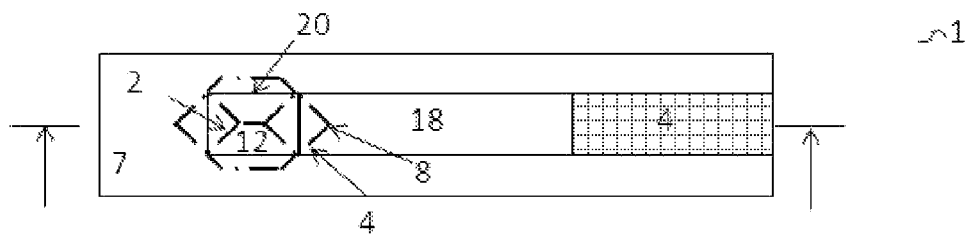
Figure 8H:
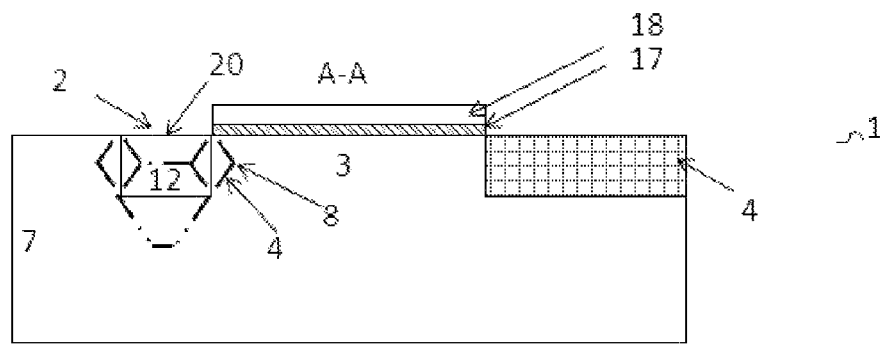

Thereafter, as shown in FIGS. 8g and 8h, a shaped source 2 is formed in contact with the channel 3 as such forming a shaped source-channel interface 4. The shaped source 3 and the interface layers 5,6 are formed as described above in detail by forming a metal-semiconductor alloy 12. The interface layers 5,6 at the border between the semiconductor metal alloy 12 and the semiconductor material 7, from which the alloy 12 is formed, are not shown.

Figure 9:
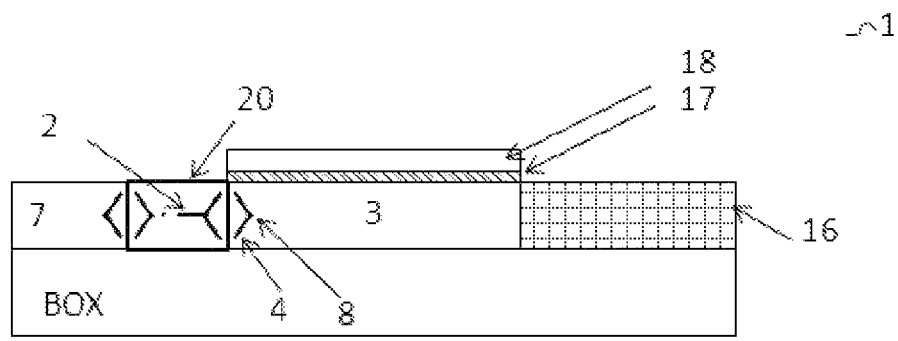
FIG. 9 show a schematic cross section of a horizontal tunnel FET manufactured according to another embodiment.

FIG. 9 schematically shows a schematic cross section of an alternative embodiment wherein the semiconductor substrate comprises an SOI substrate. The semiconductor layer of the semiconductor-on-insulator substrate is used as the first crystalline semiconductor material 7. The trench 20 in the semiconductor substrate at the location of the source 2 is in this case formed, and thereafter filled with the metal 11, down to the semiconductor-oxide interface of the SOI substrate, i.e. down to the so-called buried oxide layer of the SOI substrate. In this embodiment no tip is formed pointing 8 towards the substrate.

As in the embodiments related to the vertical tunnel FET, the shape of the source 2 depends on shape of the contact area between the layer 14 of the alloying metal 11 and the source 2. For a horizontal tunnel FET, this contact area is determined by the dimensions of the opening 20 formed in the semiconductor 7 substrate. When a square opening is formed, the shaped source 2 will resemble a pyramidal shape as illustrated in FIGS. 8a to 8h. When a more rectangular opening is formed, the shaped source 2 will more resemble a wedge shape.

Figure 10A:
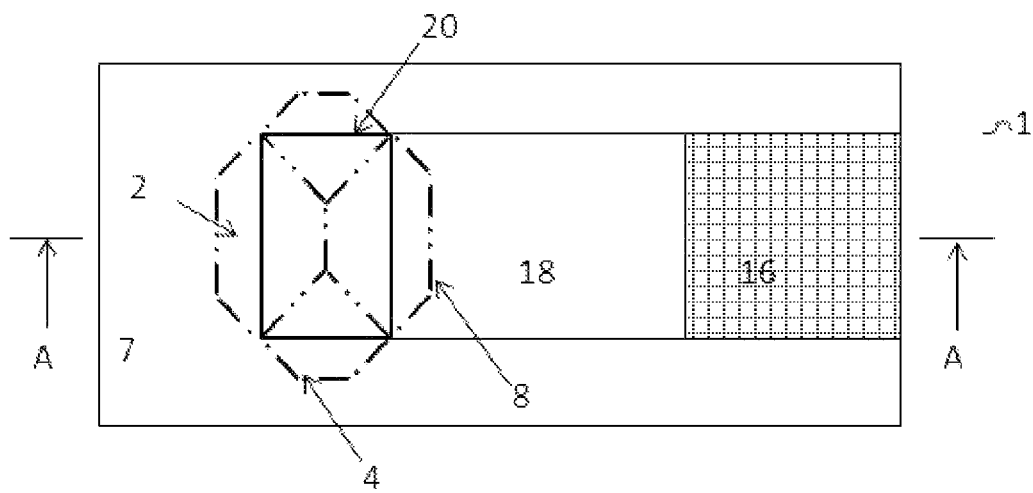
FIGS. 10*a* and 10*b* show respectively a top view and the corresponding schematic cross section A-A of a horizontal tunnel FET manufactured according to another embodiment.
Figure 10B:
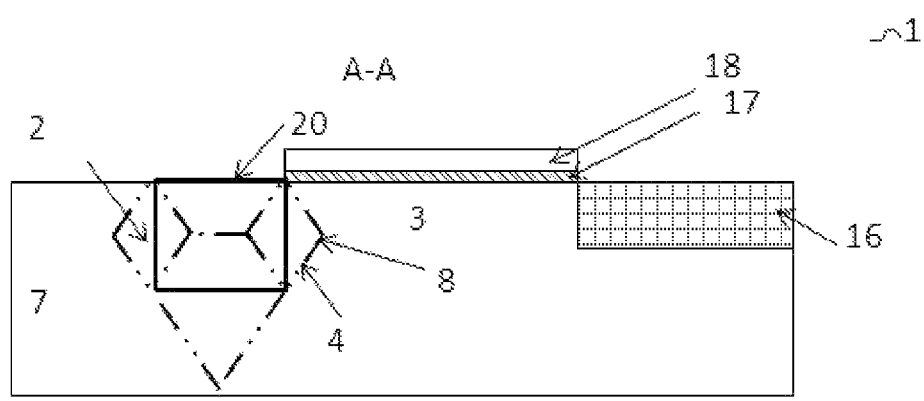

As in the embodiments related to the vertical tunnel FET, the shape of the source 2 depends on shape of the contact area between the layer 14 of the alloying metal and the source 2. For a horizontal tunnel FET, this contact area is determined by the dimensions of the vertical side planes of the opening 20 formed in the semiconductor 7 substrate. When a square vertical side plane of the opening is formed, the shaped source 2 will resemble a pyramidal shape as illustrated in FIGS. 8a to 8h. When a more rectangular vertical side plane of the opening is formed, the shaped source 2 will more resemble a wedge shape. The latter embodiment is illustrated in FIGS. 10a and 10b. FIG. 10b show the cross section A-A of FIG. 10a. Only the interface 4 is indicated in these figures.

What is claimed is:

1. A tunnel field effect transistor, comprising an interface between a source and a channel and an interface between a drain and the channel, wherein a source side of the interface between the source and the channel is a source side interface layer of a first crystalline semiconductor material that is substantially uniformly doped with a metal to a solubility level of the metal in the first crystalline material, wherein a channel side of the interface between the source and the channel is a channel side interface layer of the first crystalline semiconductor material doped with the metal, and wherein a concentration of the metal decreases from the channel side of the interface between the source and the channel towards the channel, wherein the interface between the source and the channel is tip-shaped or wedge-shaped, and wherein the interface between the drain and the channel is planar.

2. The tunnel field effect transistor of claim 1, wherein the source side interface layer is substantially uniformly doped with a second dopant at a second concentration level and the channel side interface layer is doped with the second dopant, wherein a concentration of the second dopant decreases from the channel side of the interface between the source and the channel towards the channel, and wherein the metal and the second dopant are different.

3. The tunnel field effect transistor of claim 2, wherein the source side interface layer has a thickness of from 5 nm to 100 nm and wherein a concentration of the metal and/or the second dopant is at least $1e19/cm^3$.

4. The tunnel field effect transistor of claim 1, wherein the channel side interface layer has a thickness of from 5 nm to 100 nm and a concentration gradient of from 10 nm/dec to 1 nm/dec.

5. The tunnel field effect transistor of claim 1, wherein a plane of the interface between the source and the channel is a {111} plane.

6. The tunnel field effect transistor of claim 5, wherein the interface between the source and the channel protrudes towards the channel.

7. The tunnel field effect transistor of claim 6, wherein the transistor is a vertical type tunnel field effect transistor.

8. The tunnel field effect transistor of claim 6, wherein the transistor is a horizontal type tunnel field effect transistor.

9. The tunnel field effect transistor of claim 8, wherein the first crystalline semiconductor material is a semiconductor material of a semiconductor-on-insulator substrate.

10. The tunnel field effect transistor of claim 1, wherein the transistor is a vertical type tunnel field effect transistor.

11. The tunnel field effect transistor of claim 1, wherein the channel further comprises a layer of a second crystalline semiconductor material adjacent to the channel side interface layer.

12. The tunnel field effect transistor of claim 1, wherein the source further comprises a layer of an alloy of the first crystalline semiconductor material and the metal, wherein the alloy layer contacts the source side interface layer.

13. The tunnel field effect transistor of claim 2, wherein the first crystalline semiconductor material is $Si_xGe_{1-x}$ with $0 \leq x \leq 1$.

14. The tunnel field effect transistor of claim 13, wherein the metal is aluminum.

15. The tunnel field effect transistor of claim 14, wherein the second dopant is a p-type dopant selected from the group consisting of B, Al, Ga, In, Tl, Pd, Na, Be, Zn, Au, Co, V, Ni, MO, Hg, Sr, Ge, Cu, K, Sn, W, Pb, O, and Fe, or an n-type dopant selected from the group consisting of Li, Sb, P, As, Bi, Te, Ti, C, Mg, Se, Cr, Ta, Cs, Ba, S, Mn, Ag, Cd, and Pt.

16. A method for manufacturing a tunnel field effect transistor, comprising:
providing a first crystalline semiconductor material;
providing a layer of a metal in contact with the first crystalline semiconductor material where a source is to be formed;

forming the source and a part of a channel by forming a layer of an alloy of the metal and the first crystalline semiconductor material, thereby forming an interface between the source and the channel; and providing a drain, wherein an interface between the drain and the channel is planar; wherein the interface between the source and the channel, at a source side of the interface between the source and the channel and in contact with the alloy, comprises a source side interface layer of the first crystalline semiconductor material that is substantially uniformly doped with the metal to a solubility level of the metal in the first crystalline material;

wherein the interface between the source and the channel, at a channel side of the interface between the source and the channel, comprises a channel side interface layer of the first crystalline semiconductor material doped with the metal, wherein a concentration of the metal decreases from the channel side of the interface between the source and the channel towards the channel;

wherein the interface between the source and the channel is tip-shaped or wedge-shaped; and wherein the interface between the drain and the channel is planar.

17. The method of claim 16, wherein the layer of metal comprises a second dopant different from the metal, and wherein the method further comprises, when forming the source side interface layer and the channel side interface layer, doping the source side interface layer and the channel side interface layer with the second dopant such that the source side interface layer is substantially uniformly doped with the second dopant at a first concentration level and the channel side interface layer is doped with the second dopant, wherein a concentration of the second dopant in the channel side interface layer decreases from the first concentration level towards the channel.

18. The method of claim 16, further comprising at least partly removing the alloy.

19. The method of claim 18, further comprising, after at least partly removing alloy, forming an electrode contacting the source.

20. The tunnel field effect transistor of claim 1, wherein the interface between the source and the channel is at an angle with a surface of a gate in contact with the channel.

* * * * *